(12) United States Patent
Schwarzenbach et al.

(10) Patent No.: US 11,282,889 B2
(45) Date of Patent: Mar. 22, 2022

(54) SUBSTRATE FOR A FRONT-SIDE-TYPE IMAGE SENSOR AND METHOD FOR PRODUCING SUCH A SUBSTRATE

(71) Applicant: Soitec, Bernin (FR)

(72) Inventors: Walter Schwarzenbach, Saint Nazaire les Eymes (FR); Oleg Kononchuk, Theys (FR); Ludovic Ecarnot, Grenoble (FR); Christelle Michau, Bernin (FR)

(73) Assignee: Soitec, Bernin (FR)

( * ) Notice: Subject to any disclaimer, the term of this patent is extended or adjusted under 35 U.S.C. 154(b) by 175 days.

(21) Appl. No.: 16/477,499

(22) PCT Filed: Jan. 10, 2018

(86) PCT No.: PCT/FR2018/050054
§ 371 (c)(1),
(2) Date: Jul. 11, 2019

(87) PCT Pub. No.: WO2018/130781
PCT Pub. Date: Jul. 19, 2018

(65) Prior Publication Data
US 2020/0127041 A1   Apr. 23, 2020

(30) Foreign Application Priority Data
Jan. 11, 2017 (FR) ...................... 1750235

(51) Int. Cl.
*H01L 27/146* (2006.01)
*H01L 21/762* (2006.01)

(52) U.S. Cl.
CPC .. *H01L 27/14685* (2013.01); *H01L 21/76254* (2013.01); *H01L 27/14625* (2013.01)

(58) Field of Classification Search
CPC ......... H01L 27/14685; H01L 27/14625; H01L 21/76254
See application file for complete search history.

(56) References Cited

U.S. PATENT DOCUMENTS

| 6,524,935 B1 | 2/2003 | Canaperi et al. |
| 2008/0050887 A1 | 2/2008 | Chen et al. |

(Continued)

FOREIGN PATENT DOCUMENTS

| TW | I303861 B | 12/2008 |

OTHER PUBLICATIONS

International Search Report for International Application No. PCT/FR2018/050054 dated Apr. 26, 2018, 2 pages.

(Continued)

*Primary Examiner* — Mark V Prenty
(74) *Attorney, Agent, or Firm* — TraskBritt

(57) ABSTRACT

A substrate for a front-side type image sensor includes a supporting semiconductor substrate, an electrically insulating layer, and a silicon-germanium semiconductor layer, known as the active layer. The electrically insulating layer includes a stack of dielectric and metallic layers selected such that the reflectivity of the stack in a wavelength range of between 700 nm and 3 μm is greater than the reflectivity of a silicon oxide layer having a thickness equal to that of the stack. The substrate also comprises a silicon layer between the electrically insulating layer and the silicon-germanium active layer. The disclosure also relates to a method for the production of such a substrate.

15 Claims, 6 Drawing Sheets

(56) References Cited

U.S. PATENT DOCUMENTS

| | | |
|---|---|---|
| 2010/0129948 A1 | 5/2010 | Isaka et al. |
| 2012/0068289 A1 | 3/2012 | Alie et al. |
| 2016/0118431 A1 | 4/2016 | Dutartre |
| 2020/0127041 A1* | 4/2020 | Schwarzenbach .......................... H01L 21/2007 |

OTHER PUBLICATIONS

International Written Opinion for International Application No. PCT/FR2018/050054 dated Apr. 26, 2018, 7 pages.
Taiwanese Office Action for Taiwanese Application No. 107101071 dated Aug. 18, 2021.

* cited by examiner

SUBSTRATE FOR A FRONT-SIDE-TYPE IMAGE SENSOR AND METHOD FOR PRODUCING SUCH A SUBSTRATE

CROSS-REFERENCE TO RELATED APPLICATIONS

This application is a national phase entry under 35 U.S.C. § 371 of International Patent Application PCT/FR2018/050054, filed Jan. 10, 2018, designating the United States of America and published in French as International Patent Publication WO 2018/130781 A1 on Jul. 19, 2018, which claims the benefit under Article 8 of the Patent Cooperation Treaty to French Patent Application Serial No. 1750235, filed Jan. 11, 2017.

TECHNICAL FIELD

The present disclosure relates to a substrate for a "front side" type imager, an imager incorporating such a substrate, and a method of manufacturing such a substrate.

BACKGROUND

The document US 2016/0118431 describes a "front side" type imager.

As illustrated in FIG. 1, the imager comprises a SOI (Semiconductor-On-Insulator) type substrate comprising, from its rear side to its front side, a silicon support substrate 1' having a certain doping, a silicon oxide layer 2' designated BOX (buried oxide) layer, and a silicon layer 3' designated active layer having a doping that can be different from that of the support substrate 1', in which is defined a matrix array of photodiodes each defining a pixel.

However, such an imager has low sensitivity in the near infrared, that is to say for wavelengths comprised between 700 nm and 3 μm.

Indeed, the active silicon layer has a coefficient of absorption that decreases markedly with the wavelength of the radiation to which it is exposed, namely around $10^6$ cm$^{-1}$ for a wavelength of 300 nm to several $10^3$ cm$^{-1}$ from 700 nm.

BRIEF SUMMARY

An aim of the disclosure is to overcome the aforementioned problem and to propose a substrate for a "front side" type imager that makes it possible to increase the absorption of light in the near infrared.

To this end, the disclosure proposes a substrate for a front side type imager, successively comprising a semiconductor support substrate, an electrically insulating layer and a semiconductor layer designated active layer, made of silicon-germanium, characterized in that the electrically insulating layer is constituted of a stack of dielectric and metal layers chosen in such a way that the reflectivity of the stack in a range of wavelengths comprised between 700 nm and 3 μm is greater than the reflectivity of a silicon oxide layer having a thickness equal to that of the stack, the substrate further comprising a silicon layer between the electrically insulating layer and the active silicon-germanium layer.

"Front side" is taken to mean in the present text the side of the imager intended to be exposed to light radiation, which is located on the same side of the substrate as the associated electronic components.

Advantageously, the thickness of the electrically insulating layer is comprised between 10 and 500 nm.

According to one embodiment, the electrically insulating layer comprises at least one metal layer intercalated between a first dielectric layer situated at the interface with the support substrate and a second dielectric layer situated at the interface with the active layer.

The metal layer may be a titanium nitride layer, and the first and second dielectric layers may be silicon oxide layers.

According to one particular embodiment, the thickness of the first silicon oxide layer is comprised between 300 and 500 nm, the thickness of the titanium nitride layer is comprised between 10 and 100 nm, and the thickness of the second silicon oxide layer is comprised between 10 and 50 nm.

Preferably, the germanium content of the active layer is less than or equal to 10%.

Advantageously, the thickness of the active layer is less than a critical thickness of the silicon-germanium layer defined as being a thickness beyond which silicon-germanium relaxation takes place.

The disclosure also relates to a front side imager comprising such a substrate and a matrix array of photodiodes in the active layer of the substrate.

Another object of the disclosure relates to a method of manufacturing such a substrate.

The method comprises the following steps:
  provision of a donor substrate comprising a semiconductor material suitable to form the epitaxial growth of the active layer, the semiconductor material being silicon;
  provision of the support substrate; and
  formation of the electrically insulating layer by deposition of a stack of dielectric and metal layers on the support substrate, the dielectric and metal layers being chosen in such a way that the reflectivity of the stack in a range of wavelengths comprised between 700 nm and 3 μm is greater than the reflectivity of a silicon oxide layer having a thickness equal to that of the stack;
  bonding of the donor substrate on the support substrate, the electrically insulating layer being at the bonding interface;
  thinning of the donor substrate so as to transfer a silicon layer onto the support substrate, and
  epitaxial growth, on the transferred silicon layer, of a monocrystalline silicon-germanium semiconductor layer to form the active layer.

According to one embodiment, the stack of dielectric and metal layers deposited on the support substrate successively comprises a first dielectric layer, a metal layer and a second dielectric layer.

According to one embodiment, the metal layer is a titanium nitride layer, and the first and second dielectric layers are silicon oxide layers.

Advantageously, the thickness of the first silicon oxide layer is comprised between 300 and 500 nm, the thickness of the titanium nitride layer is comprised between 10 and 100 nm, and the thickness of the second silicon oxide layer is comprised between 10 and 50 nm.

According to a preferred embodiment, the method comprises a step of formation of an embrittlement zone in the donor substrate so as to delimit a layer of the semiconductor material to transfer onto the support substrate, and the thinning of the donor substrate comprises a detachment along the embrittlement zone.

Advantageously, the formation of the embrittlement zone comprises the following steps:
  formation of a sacrificial oxide layer on the donor substrate, implantation of atomic species in the donor substrate through the sacrificial oxide layer, and removal of the sacrificial oxide layer before the bonding of the donor substrate on the support substrate.

The thickness of the silicon layer transferred onto the receiver substrate is typically less than or equal to 400 nm.

At the end of the epitaxial growth of silicon-germanium, the silicon layer may be conserved between the electrically insulating layer and the silicon-germanium layer.

Alternatively, the method may further comprise a step of condensation of the silicon-germanium of the active layer so as to convert the silicon layer, from which the epitaxial growth of silicon-germanium has been carried out, into a silicon-germanium layer.

According to another embodiment, the semiconductor material of the donor substrate suitable for the epitaxial growth of the active layer is silicon-germanium.

The semiconductor material is advantageously formed by epitaxy on a base substrate, the semiconductor material and the base substrate together forming the donor substrate.

BRIEF DESCRIPTION OF THE DRAWINGS

Other characteristics and advantages of the disclosure will become clear from reading the detailed description that follows, with reference to the appended drawings, in which.

For reasons of legibility of the figures, the different layers are not necessarily represented to scale.

DETAILED DESCRIPTION

Figure 1:
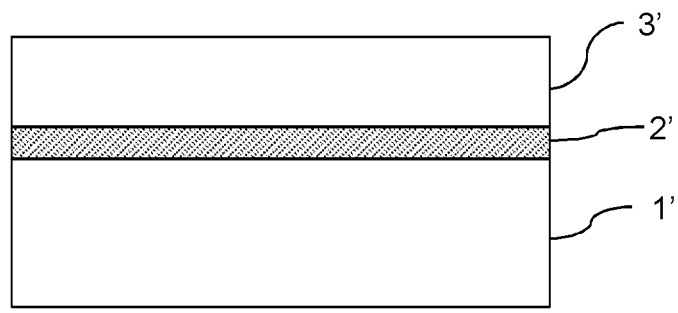
FIG. 1 is a sectional view of a SOI substrate for a front side imager as described in the document US 2016/0118431.
Figure 2:
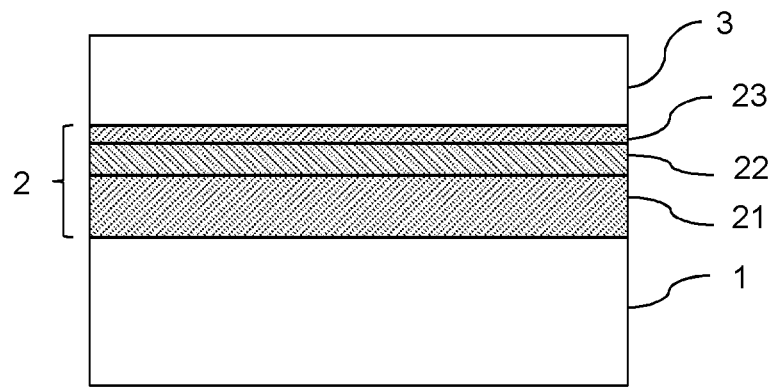
FIG. 2 is a sectional view of a substrate for a front side imager wherein the electrically insulating layer is constituted of a stack of dielectric and metal layers.

FIG. 2 is a sectional view of a substrate for a front side imager.

The substrate successively comprises, from its rear side to its front side, a semiconductor support substrate 1, an electrically insulating layer 2 and a monocrystalline semiconductor layer 3 designated active layer.

The support substrate 1 is generally obtained by cutting of a monocrystalline ingot. Advantageously, the support substrate 1 is made of silicon.

The active layer 3 is intended to receive a matrix array of photodiodes (not represented) enabling the capture of images. The thickness of the active layer 3 is typically greater than or equal to 1 µm. According to one embodiment, the active layer 3 is made of monocrystalline silicon. The active layer 3 may be lightly doped.

The electrically insulating layer 2 is not, as in conventional SOI substrates, a silicon oxide layer, but is constituted of a stack of dielectric and metal layers chosen so as to increase the reflectivity of the electrically insulating layer in the infrared.

More precisely, the dielectric and metal layers forming this stack are chosen in such a way that the reflectivity of the stack in a range of wavelengths comprised between 700 nm and 3 µm is greater than the reflectivity of a silicon oxide layer having a thickness equal to that of the stack.

Furthermore, a metal layer of the stack is advantageously separated from the support substrate and from the active layer by at least one dielectric layer. The dielectric layer ensures, in particular, a function of electrical insulation of the active layer vis-à-vis the support substrate.

For example, in the embodiment illustrated in FIG. 2, the electrically insulating layer 2 successively comprises:

a first silicon oxide layer 21 at the interface with the support substrate 1, a titanium nitride layer 22, and a second silicon oxide layer 23, at the interface with the active layer 3.

Titanium nitride is a metal material widely used in microelectronics.

The dielectric silicon oxide layers 21 and 23 make it possible to encapsulate the titanium nitride layer and thereby avoid any metal contamination of the active layer. The generation of electrical defects at the interface between the active layer and the electrically insulating layer and re-combinations between the silicon of the active layer and the metal components of the imager, capable of doping the active layer, are thereby avoided.

Typically, the layer 21 has a thickness comprised between 300 and 500 nm, the layer 23 a thickness comprised between 10 and 50 nm, and the layer 22 a thickness comprised between 10 and 100 nm.

Such an electrically insulating layer has the advantage of reflecting more photons transmitted through the active layer 3 than a silicon oxide layer of identical thickness.

Figure 3:
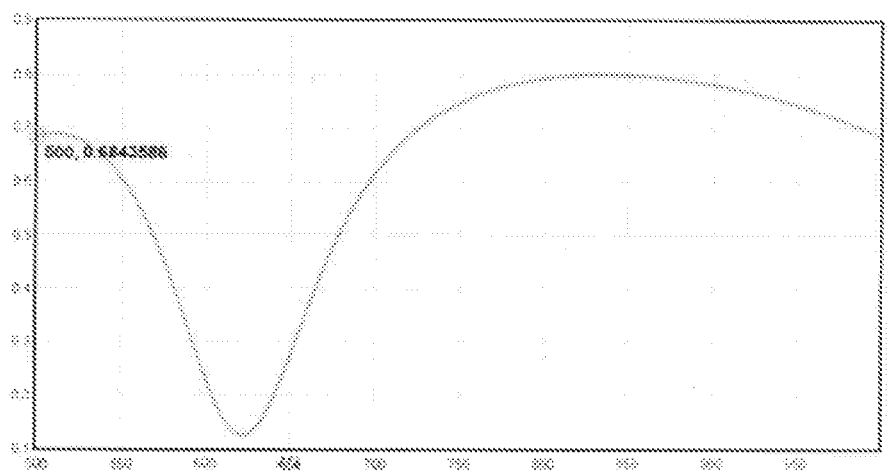
FIG. 3 illustrates the reflectivity of a stack of dielectric layers as a function of wavelength (in nm)

This is visible in FIG. 3, which shows the reflectivity of the following stack (from the support substrate to the active layer) as a function of wavelength (in nm):

the first silicon oxide layer 21, of 400 nm thickness, the titanium nitride layer 22, of 50 nm thickness, and the second silicon oxide layer 23, of 20 nm thickness.

A reflectivity reaching 0.8 for a wavelength of 850 nm is thereby obtained. As a comparison, a 400 nm layer of silicon oxide has a reflectivity of 0.5 for a wavelength of 850 nm.

This increased reflectivity has the effect of increasing the length of the path of the photons within the active layer 3, and thereby of favoring their absorption by the layer.

Examples of methods of manufacturing the substrate illustrated in FIG. 2 will now be described.

Generally speaking, the method of manufacturing a substrate according to the disclosure comprises the following steps.

On the one hand, a donor substrate is provided comprising a semiconductor material suitable for the epitaxial growth of the material intended to form the active layer. Advantageously, the material is monocrystalline silicon. Alternatively, when the active layer has to be made of silicon-germanium (SiGe) as will be seen below, the material may be silicon-germanium (enabling homoepitaxy).

On the other hand, a receiver substrate is provided, and the donor substrate is bonded on the receiver substrate, an electrically insulating layer being at the bonding interface.

The donor substrate is next thinned so as to transfer a layer of the semiconductor material onto the receiver substrate.

This thinning may be carried out by polishing or etching of the semiconductor material so as to obtain the thickness and the surface state desired for the epitaxy of the material of the active layer.

However, advantageously, before the bonding step, an embrittlement zone is formed in the semiconductor material so as to delimit a superficial layer to transfer. Preferably, the formation of the embrittlement zone is achieved by implantation of atomic species, such as hydrogen and/or helium, in the donor substrate. After the bonding step, the thinning consists in detaching the donor substrate along the embrittlement zone, which leads to the transfer of the superficial layer onto the receiver substrate (method known as Smart Cut™). The thickness of the transferred layer is typically less than or equal to 400 nm. Potentially, a finishing treatment of the free surface of the transferred layer is carried out in order to favor the implementation of the epitaxy, the treatment being able to lead to thinning of the transferred layer.

In the case where such an implantation is implemented in the donor substrate, the stack of dielectric and metal layers is not formed on the donor substrate but on the support substrate. Indeed, such a stack would be too thick for the implantation. On the other hand, advantageously, before implantation, a sacrificial silicon oxide layer, through which the atomic species intended to form the embrittlement zone are implanted, is formed on the donor substrate. The sacrificial layer makes it possible to avoid any channeling effect during implantation. The sacrificial layer is next removed from the donor substrate before the bonding thereof on the support substrate.

Finally, on the transferred layer of semiconductor material, which serves as seed layer, the epitaxial growth of the material of the active layer is implemented until the desired thickness for the active layer is obtained.

FIGS. 4A to 4E illustrate one preferred embodiment of a substrate for a front side imager comprising such a stack of dielectric layers.

Figure 4A:
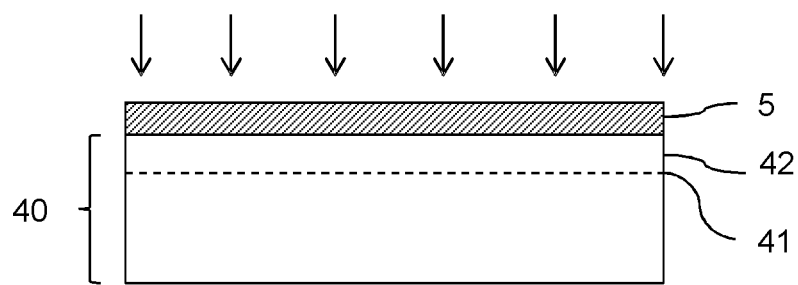
FIGS. 4A-4E illustrate the main steps of a method of manufacturing the substrate for a front side imager according to one embodiment of the disclosure.

With reference to FIG. 4A, a donor silicon substrate 40 covered by a sacrificial silicon oxide layer 5 is provided, then an embrittlement zone 41 delimiting a silicon layer 42 to transfer is formed by implantation of atomic species through the sacrificial silicon oxide layer 5. After the implantation, the sacrificial silicon oxide layer 5 is removed, for example, by chemical etching.

Figure 4B:
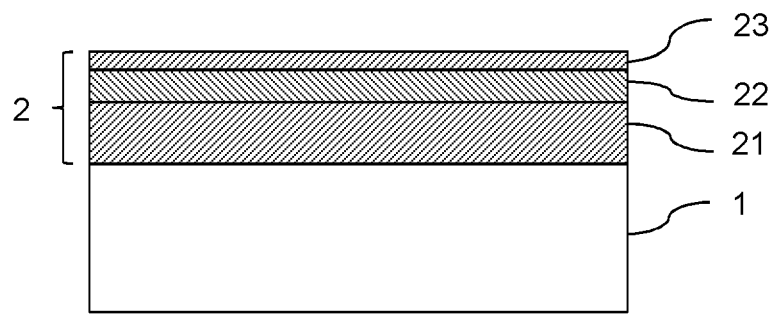

With reference to FIG. 4B, a receiver substrate is moreover provided, which is typically the support substrate 1 of the final substrate, on which the stack of layers 21, 22, 23 intended to form the electrically insulating layer 2 is formed.

Figure 4C:
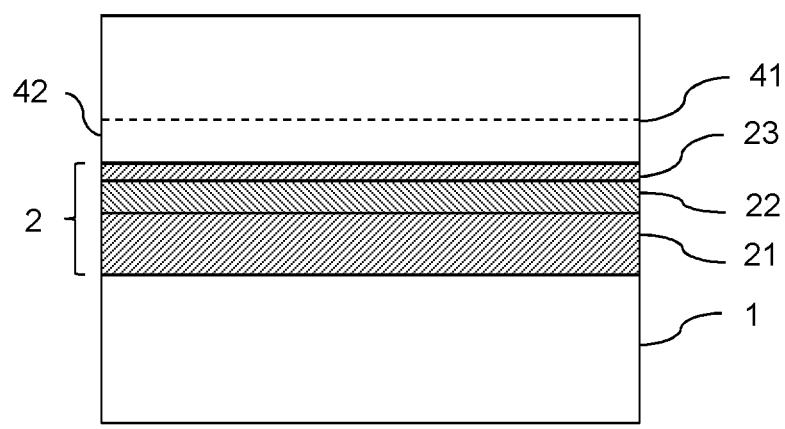

With reference to FIG. 4C, the donor substrate 40 is bonded on the support substrate 1, the stack of dielectric and/or metal layers forming the electrically insulating layer 2 being at the bonding interface.

Next, the donor substrate is detached along the embrittlement zone 41. The detachment may be initiated by any technique known to those skilled in the art, such as a mechanical, chemical, and/or thermal stress.

Figure 4D:
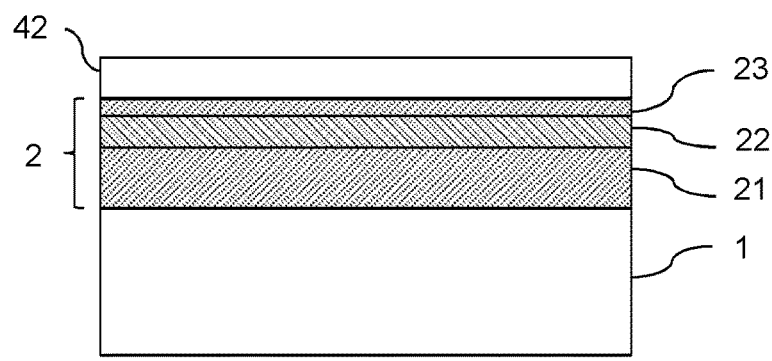

The silicon layer 42 of the donor substrate is thereby transferred onto the support substrate 1 (cf. FIG. 4D).

If need be, a surface treatment of the transferred layer is carried out to remove defects linked to the implantation and to the detachment, and to make it sufficiently smooth for the epitaxy step that is going to follow.

Figure 4E:
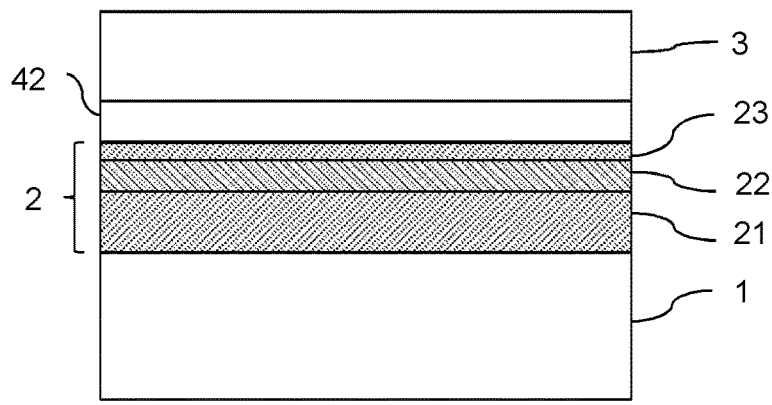

With reference to FIG. 4E, epitaxy of the material of the active layer is then continued on the transferred layer 42 which serves as seed layer, up to the desired thickness for the active layer 3. During epitaxy, it is possible to dope lightly the active layer 3, depending on the desired electrical properties.

The active layer may be made of monocrystalline silicon and the transferred layer serving as seed layer is then also made of monocrystalline silicon (homoepitaxy).

Particularly advantageously, the active layer is made of monocrystalline silicon-germanium, the transferred layer serving as seed layer being able to be made of monocrystalline silicon or monocrystalline SiGe.

A particular advantage of monocrystalline SiGe compared to monocrystalline silicon is its capacity to adsorb radiation in the near infrared.

Figure 5:
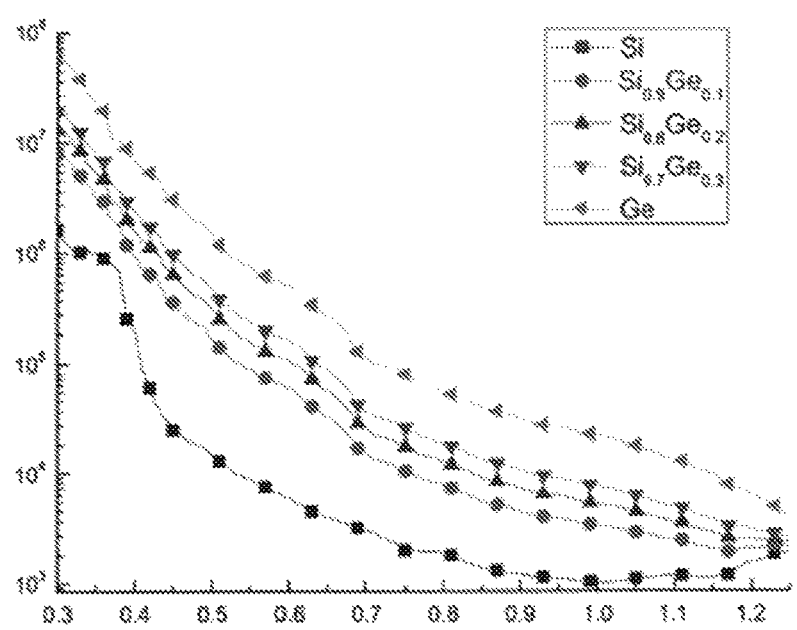
FIG. 5 shows the coefficient of absorption of silicon-germanium as a function of wavelength for different germanium contents.

As may be seen in FIG. 5, which illustrates the coefficient of absorption (in $cm^{-1}$) of SiGe as a function of wavelength (in μm) for different compositions of the material, the coefficient of absorption, in particular, in the infrared, increases with the germanium content.

However, the design of the active layer 3 does not only concern the concentration of germanium but also the thickness of the layer. Indeed, since the SiGe layer is formed by epitaxy on a silicon substrate, the lattice parameter of which is different to that of silicon-germanium, relaxation of the SiGe layer takes place beyond a certain thickness, designated critical thickness. This relaxation results in the formation of dislocations within the SiGe layer.

Such dislocations would make the SiGe layer inappropriate for the function of the active layer 3 and must thus be avoided.

Figure 6:
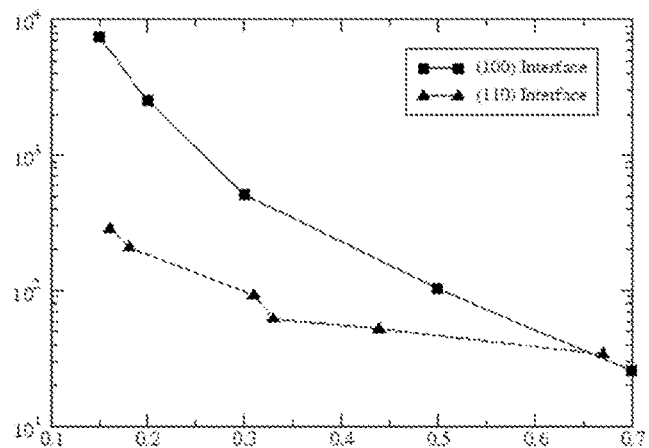
FIG. 6 shows the critical thickness of a silicon-germanium layer as a function of the germanium content thereof.

As shown in FIG. 6, which illustrates the critical thickness (in Å) of a SiGe layer as a function of the germanium content (stoichiometric coefficient x corresponding to the composition $Si_{1-x}Ge_x$), the critical thickness is all the smaller the greater the germanium concentration.

The thickness of the active layer 3 and the germanium concentration of the layer thus result from a compromise between:
  on the one hand, a sufficiently large thickness to capture
    a maximum of photons in the wavelengths of the near
    infrared,
  on the other hand, a sufficient concentration of germanium
    to increase the capacity to absorb photons by the active
    layer, in particular, in the near infrared, and
  limited thickness (depending on the concentration) to
    avoid silicon-germanium relaxation and the creation of
    crystalline defects (dislocations) that result therefrom.

Typically, it is sought to maximize the thickness and the germanium concentration of the active layer 3 in order to have the best possible absorption in the infrared.

Preferably, the germanium content of the active layer is less than or equal to 10%. FIG. 6 shows in fact that the critical thickness of a $Si_{0.9}Ge_{0.1}$ layer is of the order of a micrometer, which is suitable for the active layer of a "front side" type imager.

Thus, with the simultaneous use of the active silicon-germanium layer and the stack of dielectric and/or metal layers forming the electrically insulating layer, the favorable effects of these two layers on the absorption of infrared radiation are combined.

Compared to the manufacturing method that has just been described, the method of manufacturing a substrate in which the active layer is made of SiGe necessitates the provision of a donor substrate comprising a semiconductor material suitable for the epitaxial growth of silicon-germanium. The material may, in particular, be SiGe (enabling homoepitaxy) or a material different to SiGe but having a lattice parameter sufficiently close to that of SiGe to enable the epitaxial growth thereof (heteroepitaxy). In this latter case, the semiconductor material is advantageously silicon.

It will be noted that, when the seed layer is not made of SiGe, for example, when it is made of silicon, at the end of the epitaxy of SiGe, the silicon layer 42 under the active layer 3 remains.

However, the seed layer is sufficiently thin (of a thickness less than or equal to 300 nm) compared to the thickness of the active layer so as not to affect notably the properties of the active SiGe layer in terms of absorption in the infrared.

However, it is possible to remove the seed layer, for example, by means of a condensation method. In a manner known per se, the method comprises an oxidation of the SiGe layer, the oxidation having the effect of consuming only the silicon (to form silicon oxide) and to make the germanium migrate to the face opposite to the free surface of the SiGe layer. A $SiO_2$ layer, which can be removed by etching, is then obtained on the surface.

According to one embodiment, illustrated in FIGS. 7A to 7F, the starting point is a donor substrate 30 comprising a superficial SiGe layer 31.

The SiGe layer is typically formed by epitaxy on a base substrate 32, generally made of silicon. The SiGe layer is sufficiently thin to be stressed.

In a first version of this embodiment, an embrittlement zone is formed in the SiGe layer.

Figure 7A:
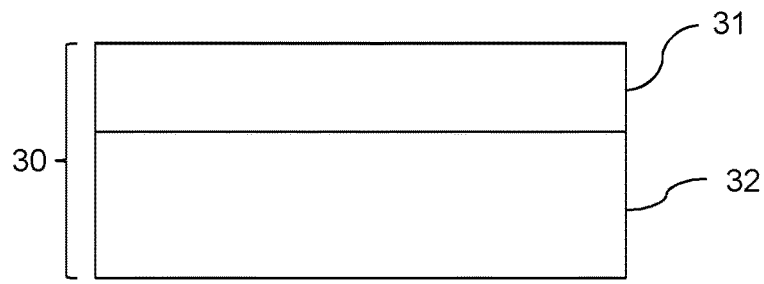
FIGS. 7A-7F illustrate the main steps of a method of manufacturing a substrate for a front side imager according to one particular embodiment of the disclosure wherein the active layer is made of silicon-germanium.
Figure 7B:
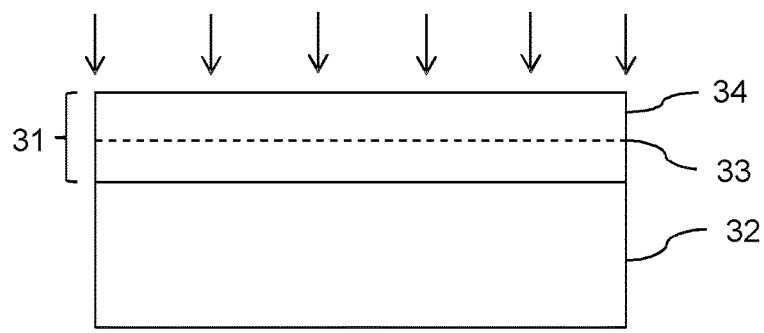

In a particularly advantageous manner, as illustrated in FIG. 7B, the embrittlement zone 33 is formed by implantation of atomic species (typically, hydrogen and/or helium) through the free surface of the SiGe layer 31. The embrittlement zone 33 thereby delimits a SiGe layer 34 at the surface of the donor substrate.

Figure 7C:
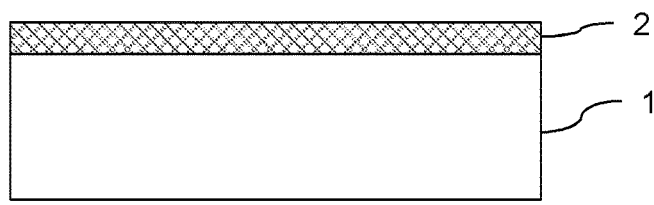

With reference to FIG. 7C, a receiver substrate is moreover provided comprising a support substrate 1 and the electrically insulating layer 2 constituted of the stack of dielectric and/or metal layers (to simplify the drawings, the layer 2 is represented as a single layer, without distinguishing the different constituent layers thereof).

Figure 7D:
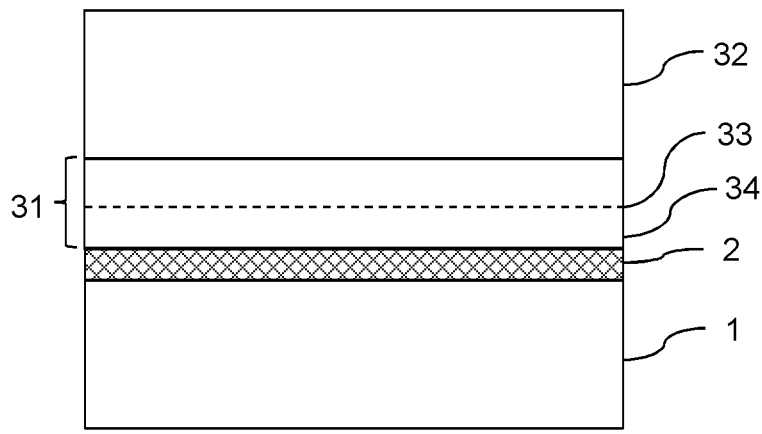

With reference to FIG. 7D, the donor substrate is bonded on the receiver substrate, the SiGe layer 31 and the electrically insulating layer 2 being at the bonding interface.

Figure 7E:
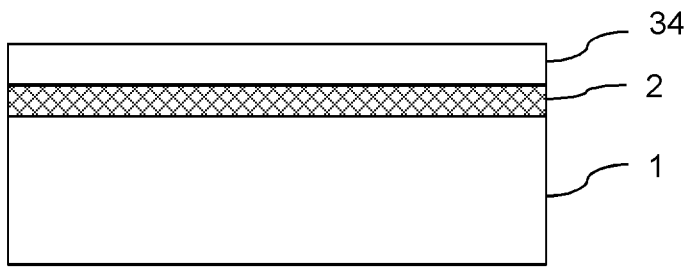

Next, as illustrated in FIG. 7E, the donor substrate is detached along the embrittlement zone. The detachment may be initiated by any technique known to those skilled in the art, such as a mechanical, chemical, and/or thermal stress.

The SiGe layer 34 is thereby transferred onto the support substrate

If need be, a surface treatment of the SiGe layer is carried out to remove defects linked to the implantation and to the detachment, and to make it sufficiently smooth for the epitaxy step that is going to follow.

Figure 8A:
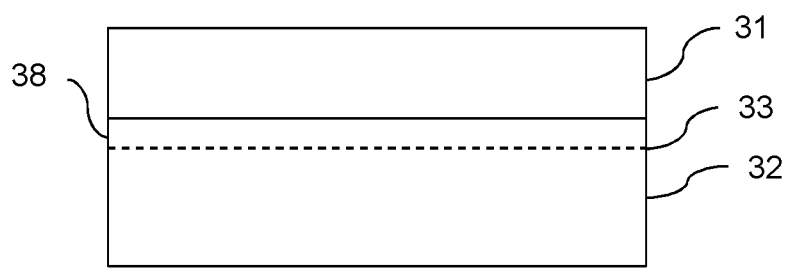
FIGS. 8A-8C illustrate the steps of an alternative of the manufacturing method illustrated in FIGS. 7A to 7F.

In a second version of this embodiment, an embrittlement zone 33 is formed in the donor substrate 30 situated under the SiGe layer 31 (cf. FIG. 8A).

In a particularly advantageous manner, the embrittlement zone 33 is formed by implantation of atomic species (typically, hydrogen and/or helium) through the free surface of the SiGe layer 31. The embrittlement zone 33 thereby delimits a SiGe layer and a portion 38 of the base substrate 32 on the surface of the donor substrate.

With reference to FIG. 7C, a receiver substrate comprising a support substrate 1 and an electrically insulating layer 2 is moreover provided.

Figure 8B:
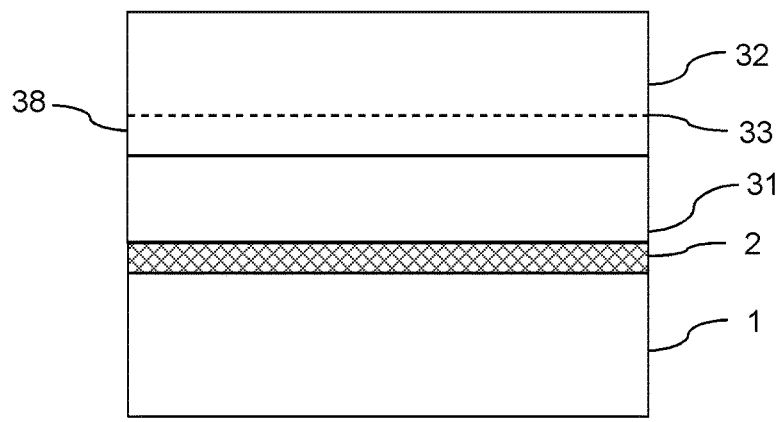

With reference to FIG. 8B, the donor substrate is bonded on the receiver substrate, the SiGe layer 31 and the electrically insulating layer 2 being at the bonding interface.

Next, the donor substrate is detached along the embrittlement zone 33. The detachment may be initiated by any technique known to those skilled in the art, such as a mechanical, chemical, and/or thermal stress.

Figure 8C:
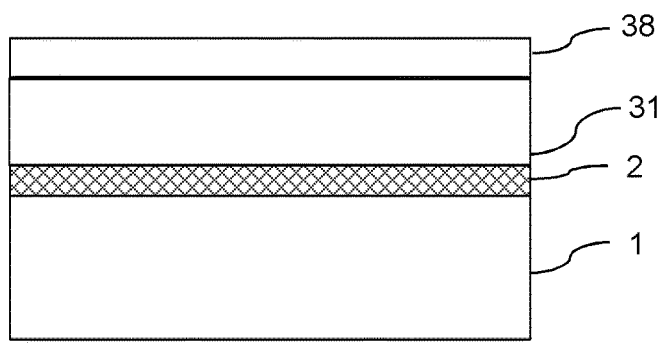

The SiGe layer 31 and the portion 38 of the base substrate are thereby transferred onto the support substrate (cf. FIG. 8C).

A treatment of the surface created is then carried out to remove the portion 38 of the superficial donor substrate until a surface of SiGe is revealed, thereby removing defects linked to the implantation and to the detachment, and making it sufficiently smooth for the epitaxy step that is going to follow.

As in FIG. 7E, a portion 38 of the SiGe layer 31 on the support substrate 1 is thereby obtained.

Figure 7F:
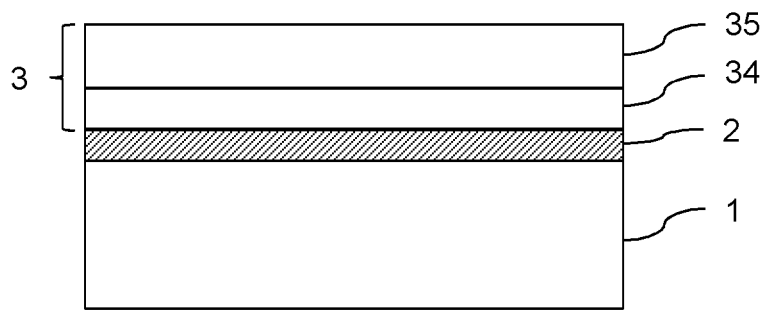

As illustrated in FIG. 7F (step common to the two versions of the embodiment), epitaxy is then resumed in order to make a SiGe layer 35 grow on the transferred SiGe layer 34 which fulfils the role of seed layer, up to the desired thickness for the active layer 3, which is formed of both of the two SiGe layers 34 and 35 together. During epitaxy, it is possible to dope lightly the SiGe layer 35, depending on the desired electrical properties. The doping of the SiGe layer 35 is not necessarily identical to that of the seed layer 34.

Figure 9:
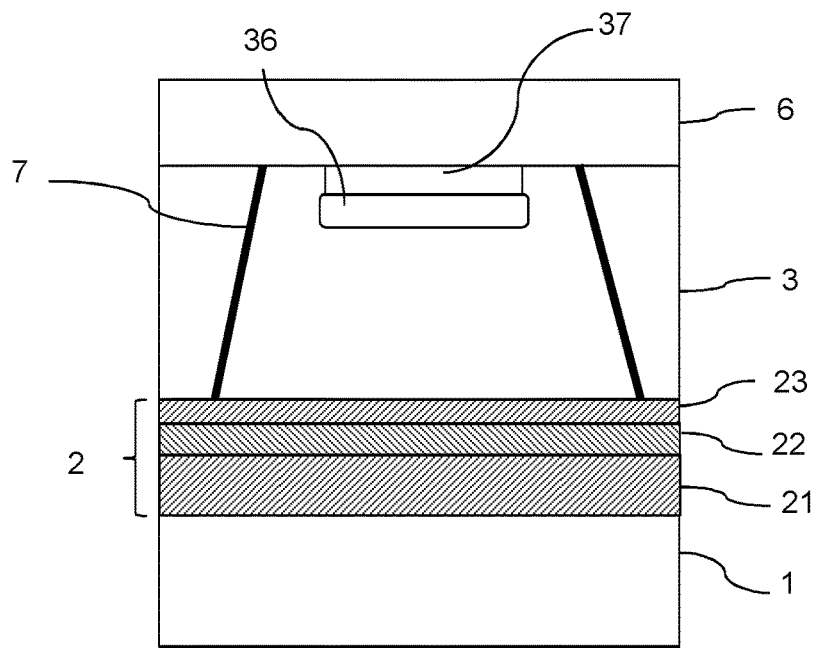
FIG. 9 is a sectional view of a pixel of a "front side" type imager comprising a substrate according to one embodiment of the disclosure.

FIG. 9 illustrates a part of a front side type imager comprising a substrate according to one embodiment of the disclosure. Only a part of the imager corresponding to a pixel is represented in this FIG., the pixel being electrically insulated from the other pixels formed in the active layer 3 by insulation trenches 7.

A doped region 36 of type different to that of the active layer 3 is formed under the surface of the front side of the active layer 3. This region 36 forms with the active layer 3 a photodiode. A region 37 formed between the region 36 and the front side of the active layer 3 advantageously has a doping level greater than that of the region 36 in order to passivate the interface. A passivation layer 6 is formed on the active layer 3 and may encapsulate elements making it possible to control the pixel electrically.

Potentially, other layers, such as filters, may be formed on the passivation layer 6, but they are not represented in FIG. 9.

The structure of the imager as such and its method of manufacture are known to those skilled in the art and will thus not be described in detail herein.

The invention claimed is:

1. A substrate for a front side type imager, comprising:
   a semiconductor support substrate;
   an electrically insulating layer comprising a stack of dielectric and metal layers, a reflectivity of the stack in a range of wavelengths between 700 nm and 3 μm being greater than a reflectivity of a silicon oxide layer having a thickness equal to that of the stack; and
   a semiconductor active layer comprising silicon-germanium; and
   a silicon layer between the electrically insulating layer and the semiconductor active layer; and
   wherein the electrically insulating layer comprises at least one metal layer intercalated between a first dielectric layer situated at an interface with the support substrate and a second dielectric layer situated at an interface with the silicon layer; and wherein the at least one metal layer comprises a titanium nitride layer.

2. The substrate of claim 1, wherein a thickness of the electrically insulating layer is between 10 nm and 500 nm.

3. The substrate of claim 1, wherein the first and second dielectric layers comprise silicon oxide layers.

4. The substrate of claim 3, wherein the thickness of the first silicon oxide layer is comprised between 300 and 500 nm, the thickness of the titanium nitride layer is comprised between 10 and 100 nm, and the thickness of the second silicon oxide layer is comprised between 10 and 50 nm.

5. The substrate of claim 1, wherein the germanium content of the active layer is less than or equal to 10%.

6. The substrate of claim 1, wherein the thickness of the active layer is less than a critical thickness of the silicon-germanium layer defined as being a thickness beyond which silicon-germanium relaxation takes place.

7. A front-side imager, comprising:
a substrate according to claim 1; and
a matrix array of photodiodes in the active layer of the substrate.

8. A method of manufacturing a substrate for a front side imager successively comprising a support substrate, an electrically insulating layer, and a semiconductor active layer, the method comprising:
providing a donor substrate comprising a semiconductor material suitable to form epitaxial growth of the semiconductor active layer, the semiconductor material comprising silicon;
providing a support substrate;
forming the electrically insulating layer by depositing of a stack of dielectric and metal layers on the support substrate, a reflectivity of the stack in a range of wavelengths between 700 nm and 3 μm being greater than a reflectivity of a silicon oxide layer having a thickness equal to that of the stack, and wherein the stack of dielectric and metal layers deposited on the support substrate successively comprises a first dielectric layer, a metal layer comprising titanium nitride, and a second dielectric layer;

bonding the donor substrate on the support substrate along an interface, the electrically insulating layer being located at the bonding interface;
thinning the donor substrate so as to transfer a silicon layer onto the support substrate; and
epitaxially growing a monocrystalline silicon-germanium semiconductor layer on the transferred silicon layer to form the active layer.

9. The method of claim 8, wherein the first and second dielectric layers comprise silicon oxide layers.

10. The method of claim 9, wherein a thickness of the first silicon oxide layer is between 300 nm and 500 nm, a thickness of the titanium nitride layer is between 10 nm and 100 nm, and a thickness of the second silicon oxide layer is between 10 nm and 50 nm.

11. The method of claim 8, further comprising forming an embrittlement zone in the donor substrate so as to delimit a layer of the semiconductor material to transfer onto the support substrate, and wherein the thinning of the donor substrate comprises detaching the donor substrate along the embrittlement zone.

12. The method of claim 11, wherein forming the embrittlement zone comprises:
forming a sacrificial oxide layer on the donor substrate;
implanting atomic species in the donor substrate through the sacrificial oxide layer; and
removing the sacrificial oxide layer before the bonding of the donor substrate on the support substrate.

13. The method of claim 8, wherein a thickness of the silicon layer transferred onto the support substrate is less than or equal to 400 nm.

14. The method of claim 8, wherein, the silicon layer is conserved between the electrically insulating layer and the silicon-germanium layer after completion of the epitaxial growth of the silicon-germanium semiconductor layer.

15. The method of claim 8, further comprising a step of condensation of the silicon-germanium semiconductor layer so as to convert the silicon layer into a silicon-germanium layer.

* * * * *